Figure 1:
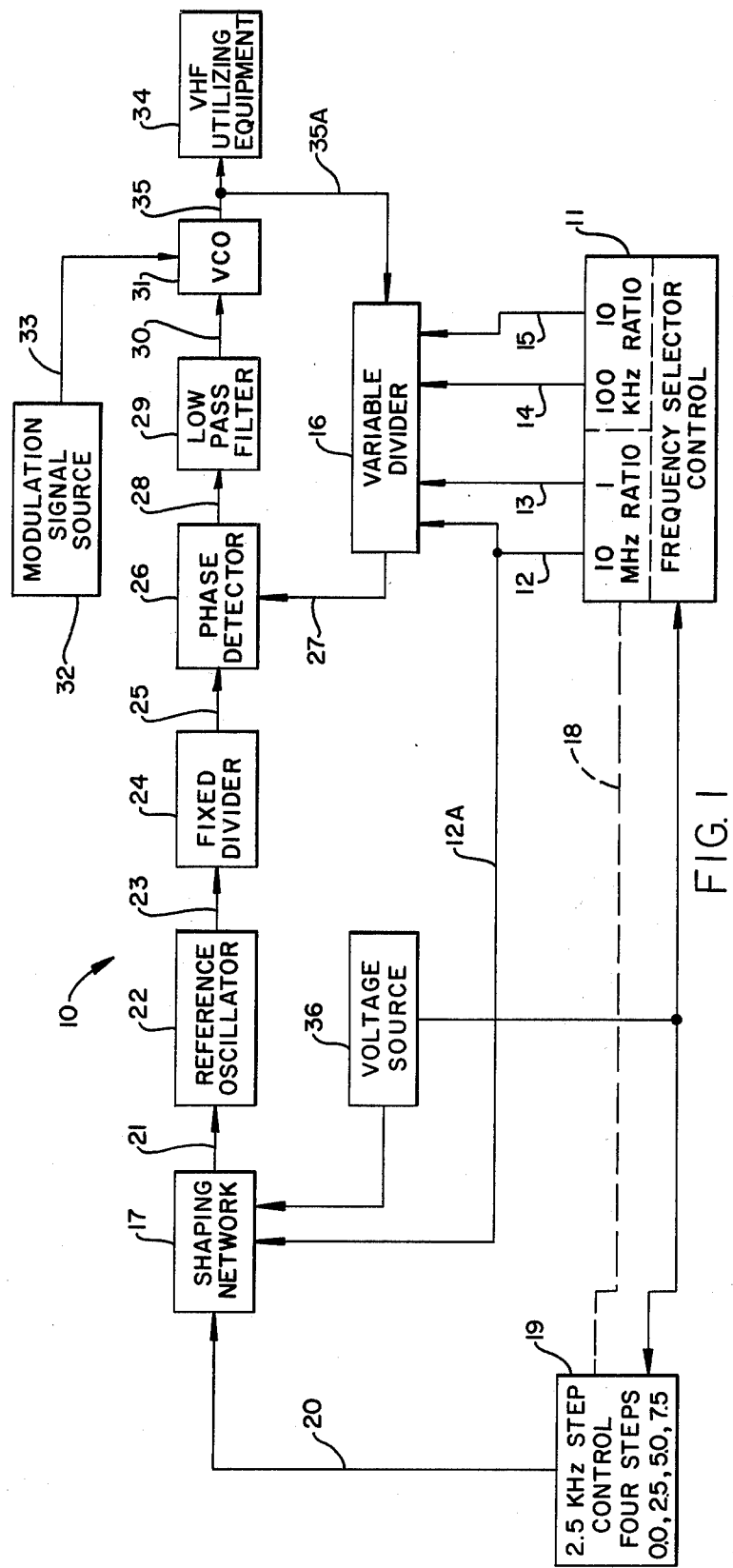

United States Patent [19]
Wulfsberg et al.

[11] 4,320,357
[45] Mar. 16, 1982

[54] VHF-FM FREQUENCY SYNTHESIZER

[76] Inventors: Paul G. Wulfsberg, 8910 W. 104th Ter., Overland Park, Kans. 66212; Dennis L. Fredrickson, 2208 W. 104th St., Leawood, Kans. 66206; Gregory L. Triplett, Rte. 1, Box 76; Ralph J. Crumrine, 1621 Sunvale Dr., both of Olathe, Kans. 66061; Cole E. Cunningham, 6202 Pineview Rd., Dallas, Tex. 75240

[21] Appl. No.: 165,026

[22] Filed: Jul. 1, 1980

Related U.S. Application Data

[63] Continuation-in-part of Ser. No. 959,642, Nov. 13, 1978, abandoned, which is a continuation of Ser. No. 811,630, Jun. 30, 1977, abandoned.

[51] Int. Cl.³ .......................... H03L 7/18; H03C 3/09
[52] U.S. Cl. ...................................... 331/16; 331/18; 331/25; 331/179; 332/19
[58] Field of Search .................. 331/1 A, 2, 16, 18, 331/25, 179; 332/19; 455/260, 264

[56] References Cited

U.S. PATENT DOCUMENTS

| | | | |
|---|---|---|---|
| 3,626,330 | 12/1971 | Zalonis | 331/177 V X |
| 3,713,040 | 1/1973 | Page, Jr. | 331/18 X |
| 3,967,057 | 6/1976 | Tsukamoto et al. | 331/36 C X |
| 3,983,484 | 9/1976 | Hodama | 331/18 X |

*Primary Examiner*—Siegfried H. Grimm
*Attorney, Agent, or Firm*—Warren H. Kintzinger

[57] ABSTRACT

A frequency synthesizer employing direct FM, as opposed to phase modulation, so subaudible tones may be transmitted, in the form of a 10 KHz increment, direct synthesizer with a skewed frequency standard deriving four intermediate 2.5 KHz tuning steps. Fast settling time of frequency change accommodates semi duplex operation, and a shaping network provides the amount of skewing changes required between band ends for substantially perfect tracking. A low division ratio programmed divider in the system maximizes transmitter signal to noise ratio, and a low pass filter in the synthesizer phase locked loop allows voice band modulation.

2 Claims, 2 Drawing Figures

VHF-FM FREQUENCY SYNTHESIZER

This application is a continuation-in-part of previous application by the same inventors, Ser. No. 959,642 filed Nov. 13, 1978, entitled VHF-FM FREQUENCY SYNTHESIZER, which in turn is a continuation of their previous application Ser. No. 811,630 filed June 30, 1977, of the same title, both now abandoned.

This invention relates to frequency synthesizers, and in particular, to a VHF-FM frequency synthesizer employing direct FM to cover a frequency range of 150.000 to 173.9975 MHz in 2.5 MHz increments in a single loop circuit for clean design and spectral purity with modulation applied to the VCO (voltage controlled oscillator) tuning voltage.

There are many existing frequency synthesizers with some so arranged that a single reference frequency determines the minimum frequency change or adjustment step available with the synthesizer. This type system limits phase locked loop servo bandwidth and does not always yield the desired level of voltage controlled oscillator quieting close in to its, or carrier, center frequency. Synthesizers employing phase modulation do not permit transmission of subaudible tones, and settling time of frequency change with many synthesizers is too slow to accommodate semi-duplex operation. Signal-to-noise ratio is also an important consideration as well as low pass filtration in the phase locked loop such as to allow voice band modulation. Fast slew time is needed for semi-duplex operation with small 2.5 KHz incremental tuning steps. It is important that this be accomplished in the absence of mixers and their resultant signal generation possibilities. The possibility of spurious and of false locks on generated spurious signals, that can happen in multi loop synthesizers, is eliminated in applicants' single loop VHF-FM frequency synthesizer.

It is, therefore, a principal object of this invention to provide a single loop circuit frequency synthesizer that transmits subaudible tones.

Another object with such a frequency synthesizer is clean design and spectral purity.

A further object is to provide a phase locked loop VHF-FM frequency synthesizer having 2.5 KHz increment tuning steps that allows voice band modulation.

Features of this invention useful in accomplishing the above objects is use of a basic 10 KHz increment, direct synthesizer, with a skewed frequency standard deriving four intermediate tuning steps of 2.5 KHz each. The circuit is a single loop circuit frequency synthesizer, yielding 2.5 KHz incremental tuning steps, not employing mixers that thereby avoids mixer spurious signal generation problems. A shaping network is provided to vary the amount of skewing between tuning band ends for substantially perfect tracking. A frequency skewing circuit is included with a shaping network that with the 10 MHz increment of the RF band selected being activated results in development of a predetermined amplifier output current being applied through the respective output resistor as an output modification of the voltage at the top of a chain of pots. In a specific implementation there are three 500 ohm pots in the chain, with the voltage as divided and calibrated by the chain of pots and switch selected to a tuning varactor diode in series with a crystal. This varies the load capacitance felt by the crystal, thereby pulling its frequency slightly with 0.0., 2.5, 5.0 and 7.5 Hz tuning lines selecting the respective voltage tap in the chain of pots to be connected to the tuning varactor diode in providing the four 2.5 KHz intermediate tuning steps.

A specific embodiment representing what is presently regarded as the best mode of carrying out the invention is illustrated in the accompanying drawings.

Figure 2:
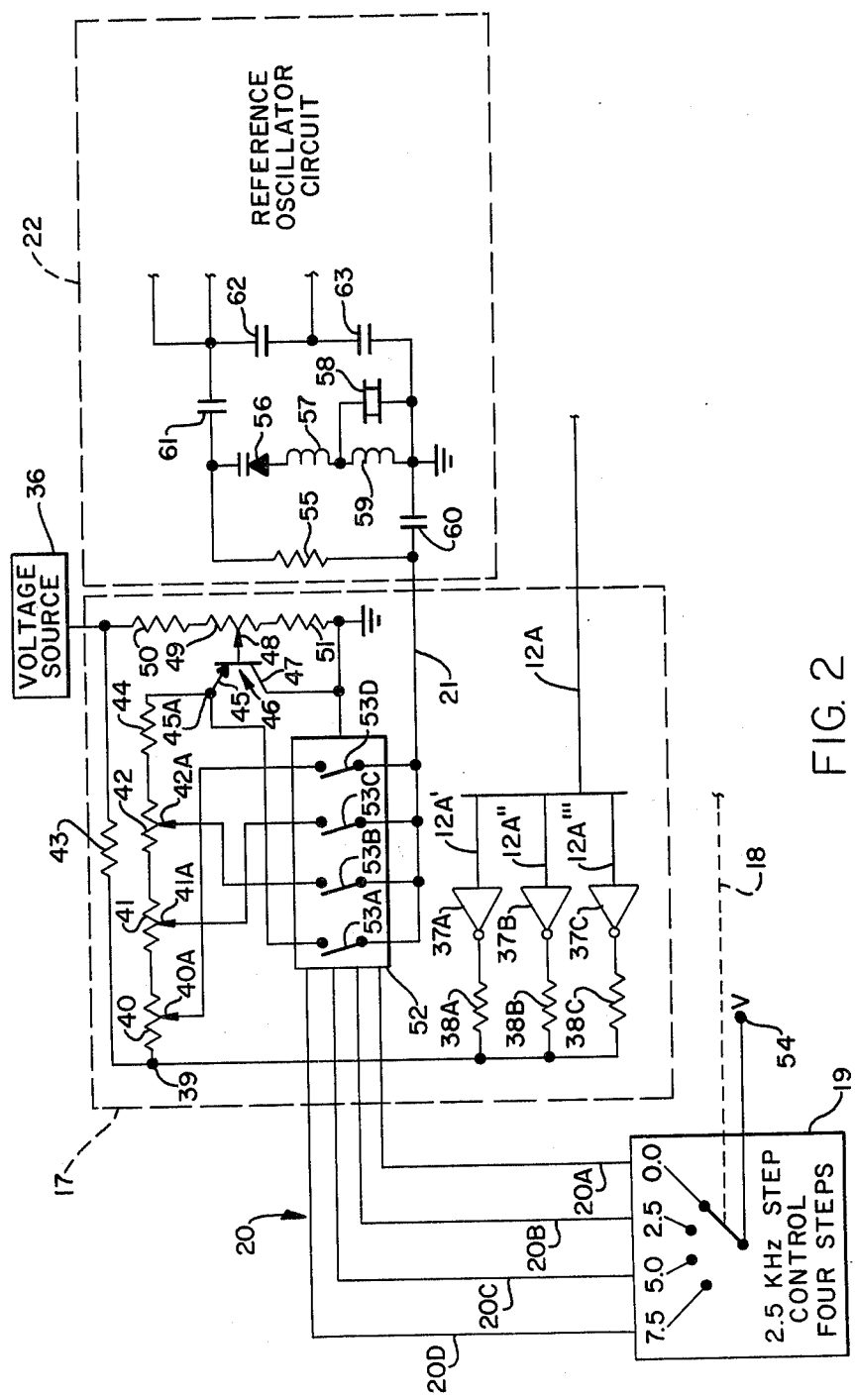

In the drawings:

FIG. 1 represents a block schematic view of a single loop VHF-FM frequency synthesizer connected to VHF signal utilizing equipment; and, FIG. 2, a block schematic of a shaping network and four intermediate 2.5 KHz tuning step skewing control system.

Referring to the drawings:

The single loop VHF-FM frequency synthesizer 10 of FIG. 1 is shown to have a frequency selector control 11 that has 10 MHz, 1 MHz, 100 KHz, and 10 KHz ratio step control output cables 12, 13, 14 and 15, respectively, connected to variable divider 16. Thus the output frequency of the synthesizer may be changed by operation of the frequency selector control 11 in decade steps, the smallest being 10 KHz steps, the next being 100 KHz steps, then 1 MHz steps and finally 10 MHz steps. As shown in FIG. 1 the signal on cable 15 controls the 10 KHz ratio of the divider, cable 14 controls the 100 KHz ratio of the divider, cable 13 the 1 MHz ratio and cable 12 the 10 MHz ratio. Obviously, with the output on cables 12, 13 and 14 indicating zero and that on cable 15 indicating 1, the lowest divider ratio of 10 KHz is selected. By further example, if cable 12 output indicates 8, cable 13 indicates 6, cable 14 indicates 7 and cable 15 indicates 5, the divider ratio selected is 86.75 MHz or 86750 KHz. Thus is the output frequency changed in steps as small as 10 KHz or as large as 10 MHz without a change in the frequency of the reference oscillator 22. The outputs on cable 12 through 15 are selected in a conventional manner through operator control of manual or electronic switches in the selector control. The cable outputs may each be of any useful conventional form to indicate numerical values from zero to nine. The 10 MHz ratio step control cable 12 of control 11 is also connected through branch 12A to shaping network circuit 17 and a mechanical drive connection 18 interconnects control 11 and the 2.5 KHz four step control 19. A selected line in output cable 20 from control 19 provides a switch activating input to the shaping network 17 that has an output line 21 connection to reference oscillator circuit 22. The output of reference oscillator circuit 22 is fed through line 23 as an input to fixed divider circuit 24 that provides a divided signal output through line 25 to a phase detector 26 also receiving the signal output of variable divider 16 as an additional input through line 27. The resulting phase detector output is applied through line 28, low pass filter 29, and line 30 as an input to voltage controlled oscillator (VCO) circuit 31 that also receives an input from modulation signal source 32 through line 33. The resulting VCO circuit output is applied both to VHF utilizing equipment 34 through line 35 and back in loop branch line 35A as a loop input to variable divider 16. A regulated DC voltage source 36 is provided that supplies DC to shaping network circuit 17, the frequency selector control circuit 11, and the 2.5 KHz four step control 19, a switch circuit that may be located with frequency selector control 11. The 2.5 KHz step control 19 provides even smaller incremental step changes in the output frequency of the VCO 31. Step changes (in increments of 2.5 KHz) of 2.5, 5 and 7.5 KHz frequency increases are obtained through control 19 which, together with shaping network 17, produces slight changes in the frequency of the reference oscillator 22.

Refer more specifically to FIG. 2 for a more detailed showing of the 2.5 KHz tuning step control 19, frequency skewing circuit 17, and reference oscillator circuit 22, along with interconnect detail. The 2.5 KHz step control 19 may be merely a mechanical or other type switch which is either in or controlled from the frequency selector control 11, as shown in the drawings. Control 19 applies an activating voltage from voltage source 36 (fed to terminal 54 in FIG. 2) to a selected one of its output lines 20A, 20B, 20C or 20D to operate switching circuit device 52, which may be a solid state switching circuit.

Solid state switching circuit device 52 is shown to include four switches 53A, 53B, 53C, and 53D, that may be transistor switches, selectively actuated by lines 20A, 20B, 20C, and 20D as switch activated by four step control 19 and driven by the frequency selector control 11. This connects a switch triggering voltage connection 54, that may be from voltage source 36, to activate a transistor switch 53A, 53B, 53C, or 53D, (or relay switch) to selectively connect one of the pot chain taps 45A, 42A, 41A, or 40A to line 21 that connects the shaping network 17 to reference oscillator circuit 22. Thus, the voltage as divided and calibrated by the pot 40, 41 and 42 chain circuit is selectively switch applied through line 21 and resistor 55 to the tuning varactor diode 56 that is connected through coil 57 in series with crystal 58 and coil 59 connected in parallel with crystal 58 to ground. This varies the load capacitance felt by the crystal 58 to thereby pull or skew its frequency slightly by the 0.0, 2.5, 5.0 or 7.5 KHz tuning step selected through control 19. Capacitor 60 is connected between line 21 and ground and capacitors 61, 62, and 63 are series connected from the junction of resistor 55 and tuning varactor diode 56 to ground with junctions between capacitors 61, 62 and 63 connected to circuitry (detail not shown) in reference oscillator circuit 22 to develop reference oscillator output on line 23 subject to the three skewing steps in the signal on line 23. These skewed tuning steps translate to the 0.0 to 2.5, 2.5 to 5.0 and 5.0 to 7.5 KHz tuning steps appearing in the signal on output line 35 from the voltage controlled oscillator (VCO) circuit 31 that are skewed steps up from every 10 KHz reference signal step increment. Thus, the frequency synthesizer is a basic 10 KHz increment direct synthesizer with a skewed frequency standard deriving three intermediate steps of 2.5 KHz each.

In a typical transceiver covering the 150.0000 to 173.9975 MHz frequency range in 2.5 KHz increments in accord with the teachings hereof please consider the following:

$$VCO = \frac{VAR.\ DIV.}{1024} \times REF$$

Transposing $$REF = \frac{1024\ (VCO)}{VAR.\ DIV.}$$

If a channel frequency of 150.000 MHz is desired $$REF = \frac{1024\ (150,000)}{15,000} = 10.240000\ MHz$$

If a 7.5 KHz is added to 150.000 MHz, then the reference is $$REF = \frac{1024\ (150.0075)}{15,000} = 10.240512\ MHz$$

this shows that the reference has to be moved 512 Hz at the low end of the band to effect a 7.5 KHz channel change. Now make the same comparison at 173.000 MHz $$REF = \frac{1024\ (173.000)}{17,300} = 10.240000\ MHz$$
$$REF = \frac{1024\ (173.0075)}{17,300} = 10.240444\ MHz$$

This shows that in effecting a like 7.5 KHz increase in the output frequency which has been selected in the higher band of over 170 MHz a reference oscillator shift of 444 Hz (rather than 512 Hz) is required. For proper tracking of the system tuning the reference oscillator frequency must be shifted by different amounts at different points over the tuning range of the synthesizer.

Thus, in effecting a 7.5 KHz channel change, the reference is to be shifted 512 Hz at a low end of the band and 444 Hz at the high end of the band, and by intermediate amounts in the midbands. The shaping network circuit 17 accomplishes this variation through slight changes in the voltage applied to the voltage divider network at tap 39.

Frequency selector control 11 output cable 12 selects the major output frequency bands of the synthesizer in 10 MHz increments. Thus, when the output on cable 12 indicates "5", the synthesizer output is in the 150 to 159 MHz band; when "6" is indicated the output is in the 160 to 169 MHz band; and when "7" is indicated the output is in 170 MHz and up band.

The band selection indication on cable 12 is also applied to cable branch 12A. The form taken by the indication signals on cables 12-15 is not critical to the present invention in that it may be digital, or binary coded digital indicator or simply a number of parallel lines each representing a different digit which are energized or activated individually to indicate the digit represented. Control cable branch 12A is shown to be three lines, 12A', 12A" and 12A''', whereby, with selective switch activation of one or more of the lines in control 11 to feed activating DC to one or more of amplifiers 37A, 37B, and 37C, current is selectively allowed through the output resistors 38A, 38B and 38C, respectively, to modify the voltage at tap point 39. Lines 12A', 12A", and 12A''' might conventionally carry a BCD code which is generated in frequency selector control 11 and is effective in establishing a countdown ratio in variable divider 16 to establish VCO operation in the 150, 160 or 170 MHz portions of the operating band; that is, to establish one of the 10-MHz digits 5, 6 or 7. Amplifiers 37A, 37B, and 37C may then respond to binary "1" input levels to cause current to flow and, thus, one or more of the control lines may carry a binary "1" level, depending on the 10-MHz digit selected, with each of the 10-MHz digits effecting a different voltage modification at tap point 39. It is noted that in the embodiment described, the 10-MHz digit is definitive of operation in the low, middle and high ends of the tuning band, and thus is the selected digit for controlling the voltage modification. Tap point 39 is at the top of a chain of pots 40, 41 and 42 (in a specific instance 500 ohm pots) in a voltage divider including a connection from DC voltage source 36 through resistor 43 the pots, 40, 41, and 42, and resistor 44 to the emitter 45 of PNP transistor 46. PNP transistor 46 has a collector 47 connection to ground and base connection to an adjustable tap 48 of pot 49 in a voltage divider connected between voltage source 36 and ground including resistor 50, pot 49, and resistor 51.

In this manner the shaping network 17 applies different increments of slewing voltage to the reference oscillator to effect the corresponding 2.5, 5 or 7.5 KHz frequency skewing steps in dependence on the indication on cable 12A of which frequency band (150, 160 or 170 MHz) is selected by the frequency selector control. Thus proper tracking of the synthesizer frequency in the 2.5 KHz increments through all bands of the synthesizer is accomplished.

A VHF-FM frequency synthesizer is provided employing direct FM that in one implementation covers a frequency range of 150.0000 to 173.9975 MHz with basic 10 KHz incremental tuning steps accomplished via frequency selector control of variable divider 16 in the single loop of the direct synthesizer. The four intermediate 2.5 KHz tuning steps between the basic 10 KHz incremental tuning steps are attained in steps from the selected basic incremental tuning steps through switch controlled skewing of the frequency standard of the reference oscillator. Further, for more perfect tracking of the skewing change induced 2.5 KHz intermediate tuning steps from basic incremental tuning steps between band ends, pot chain circuit voltage bias is step varied to compensate for skewing change between band ends. That is, through a tuning range spanning many megahertz (MHz) the voltage bias at the top of the pot chain used in deriving 2.5 KHz reference oscillator induced skewing change tuning steps is step changed at, for example, 10 MHz intervals more or less to compensate for skewing change between tuning band ends.

Whereas this invention is herein illustrated and described with respect to a specific embodiment hereof, it should be realized that various changes may be made without departing from essential contributions to the art made by the teachings hereof.

We claim:

1. A voltage variable reference crystal oscillator and control means therefor, for use as a reference oscillator in a frequency synthesizer loop; said loop comprising a phase detector, a voltage controlled output oscillator receiving the output of said phase detector as a frequency controlling input thereto, the output of said voltage controlled oscillator comprising the output of said frequency synthesizer and being additionally applied to a selectively variable frequency divider, the output of said reference oscillator and the output of said frequency divider applied as respective inputs to said phase detector, whereby said voltage controlled oscillator is frequency controlled such that the output frequency of said frequency divider equates to that of said reference oscillator, said frequency divider comprising means for selectively establishing incremental step tuning steps of such voltage controlled oscillator over a predetermined range of operating frequencies; said reference oscillator control means effecting variation in the voltage controlled oscillator output frequency in further selected sub-incremental steps between said frequency divider defined incremental tuning steps and comprising DC variation control means providing a frequency controlling DC input to said reference oscillator for varying said reference frequency oscillator output over predetermined voltage bias controlled tuning steps to higher frequencies from a loop output incremental step-defining output frequency selected; wherein said DC variation control means includes voltage divider means having a plurality of control voltage level defining output taps and including a DC voltage supply source applied as input across said voltage divider means; a plurality of switch means connected between respective individual ones of said output taps and a DC frequency-controlling input means of said reference oscillator, and means for selectively controlling activation of individual ones of said switch means to effect different ones of said reference frequency oscillator sub-incremental tuning steps; and further comprising voltage modifying means connected to said voltage divider means to selectively vary the voltages appearing at said voltage level taps to effect selectively different DC control voltage output ranges for each of contiguous portions of the frequency synthesizer output frequency range.

2. The reference oscillator system of claim 1, wherein said voltage modifying means includes a plurality of DC amplifiers respective outputs of which are connected in common to said voltage divider means, means for selectively activating said DC amplifiers to effect different voltage levels at the common connection of said DC amplifiers to said voltage divider means; and selective activation means for activating a different permutation of ones of said plurality of DC amplifiers in response to frequency selector control operation in each of said contiguous portions of the operating frequency band of said output oscillator.

* * * * *